United States Patent
Okoshi et al.

(10) Patent No.: US 12,237,167 B2
(45) Date of Patent: Feb. 25, 2025

(54) DEPOSITION METHOD

(71) Applicant: Tokyo Electron Limited, Tokyo (JP)

(72) Inventors: Ken Okoshi, Yamanashi (JP); Yamato Tonegawa, Yamanashi (JP); Keiji Tabuki, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 346 days.

(21) Appl. No.: 17/648,438

(22) Filed: Jan. 20, 2022

(65) Prior Publication Data

US 2022/0254629 A1 Aug. 11, 2022

(30) Foreign Application Priority Data

Feb. 5, 2021 (JP) ................... 2021-017307

(51) Int. Cl.
*H01L 21/02* (2006.01)
*C23C 16/34* (2006.01)
*C23C 16/458* (2006.01)

(52) U.S. Cl.
CPC ...... *H01L 21/02219* (2013.01); *C23C 16/345* (2013.01); *C23C 16/4584* (2013.01); *H01L 21/0217* (2013.01); *H01L 21/02271* (2013.01)

(58) Field of Classification Search
CPC ................................ H01L 21/02219
See application file for complete search history.

(56) References Cited

U.S. PATENT DOCUMENTS

| | | | | |
|---|---|---|---|---|
| 2005/0196977 A1* | 9/2005 | Saito | ............... | H01L 21/02277 438/791 |
| 2005/0287775 A1* | 12/2005 | Hasebe | ............ | C23C 16/45542 438/503 |
| 2007/0190807 A1* | 8/2007 | Misra | ............... | H01L 21/31645 438/785 |
| 2016/0148806 A1 | 5/2016 | Henri et al. | | |

FOREIGN PATENT DOCUMENTS

| | | |
|---|---|---|
| JP | 2006-179819 | 7/2006 |
| JP | 2006-270016 | 10/2006 |
| JP | 2009-500857 | 1/2009 |

\* cited by examiner

*Primary Examiner* — William A Harriston
(74) *Attorney, Agent, or Firm* — IPUSA, PLLC

(57) ABSTRACT

With respect to a method of depositing a silicon nitride film on a surface of a substrate, the method includes depositing the silicon nitride film on the surface of the substrate by intermittently supplying trisilylamine into a processing chamber accommodating the substrate.

4 Claims, 8 Drawing Sheets

| | EMBODIMENT | COMPARATIVE EXAMPLE |
|---|---|---|
| CROSS-SECTIONAL SHAPE | 120, 110, 111 | 120, 110, 111 |
| STEP COVERAGE | 99% | 99% |

FIG.8

| | CROSS-SECTIONAL SHAPE | STEP COVERAGE |
|---|---|---|
| EMBODIMENT | | 99% |
| COMPARATIVE EXAMPLE | | 99% |

DEPOSITION METHOD

CROSS-REFERENCE TO RELATED APPLICATIONS

This patent application is based on and claims priority to Japanese Patent Application No. 2021-017307 filed on Feb. 5, 2021, the entire contents of which are incorporated herein by reference.

TECHNICAL FIELD

The present disclosure relates to a deposition method.

BACKGROUND

A deposition method, in which an impurity-containing silicon nitride film is deposited on a surface of a wafer by supplying a silane-based gas, a nitride gas, and an impurity-containing gas to a vacuumed processing chamber, is known (see, for example, Patent Document 1).

RELATED ART DOCUMENT

Patent Document

[Patent Document 1] Japanese Laid-open Patent Application Publication No. 2006-270016

SUMMARY

According to one aspect of the present disclosure, with respect to a method of depositing a silicon nitride film on a surface of a substrate, the method includes depositing the silicon nitride film on the surface of the substrate by intermittently supplying trisilylamine into a processing chamber accommodating the substrate.

BRIEF DESCRIPTION OF THE DRAWINGS

FIG. 8 is a diagram comparing cross-sectional shapes and step coverages of the silicon nitride films.

DETAILED DESCRIPTION OF EMBODIMENTS

Figure 1:
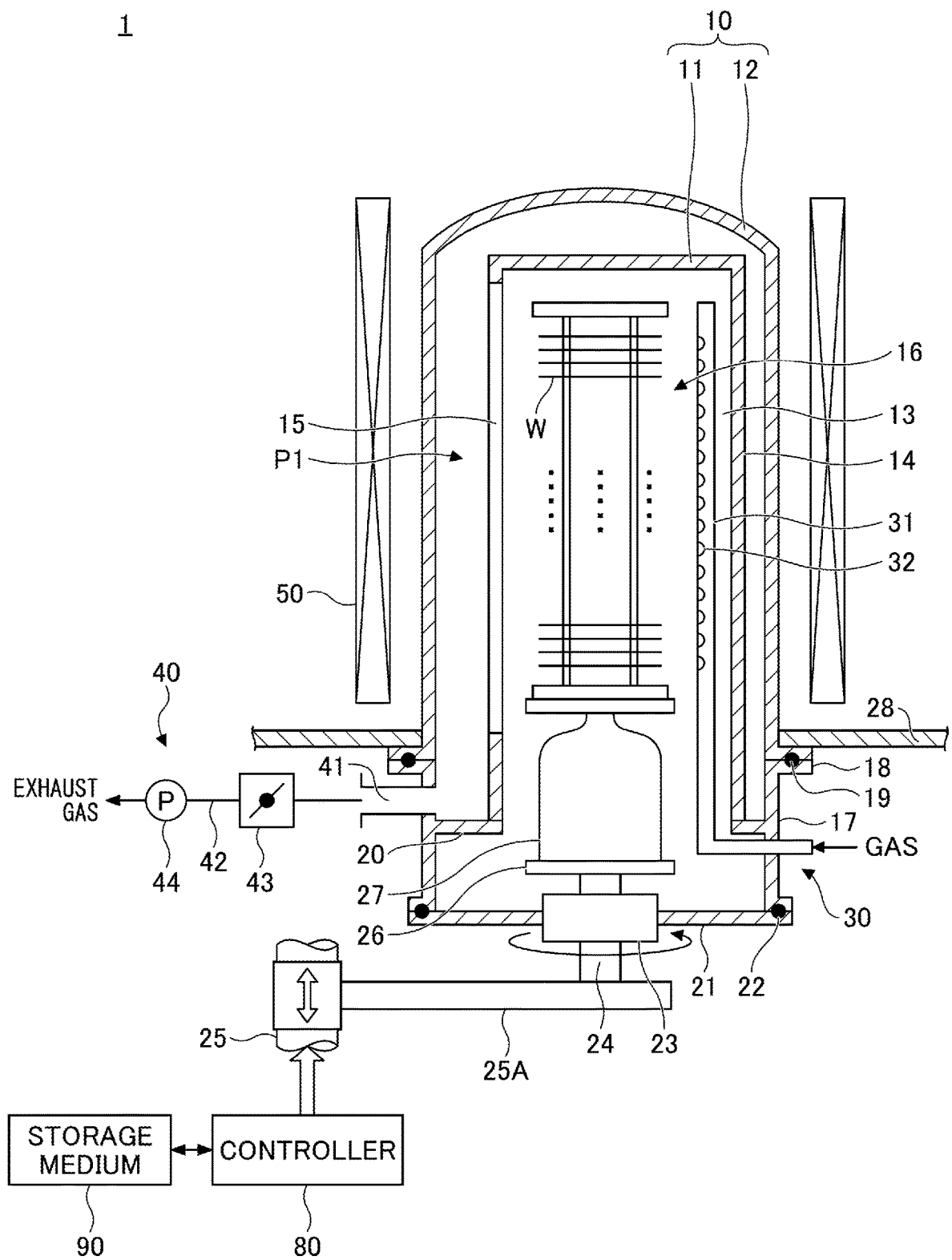
FIG. 1 is a schematic diagram illustrating an example of a processing apparatus of an embodiment.

In the following, non-restrictive exemplary embodiments of the present disclosure will be described with reference to the accompanying drawings. In all the accompanying drawings, the same or corresponding members or parts will be referred by the same or corresponding reference numerals, and the description is omitted.

[Processing Apparatus]

An example of a processing apparatus in which a deposition method according to the embodiment can be performed will be described with reference to FIG. 1. As illustrated in FIG. 1, a processing apparatus 1 is a batch-type apparatus that performs processing on multiple substrates at one time. The substrate may be, for example, a semiconductor wafer (hereinafter simply referred to as a "wafer W").

The processing apparatus 1 includes a processing chamber 10, a gas supply 30, an exhaust 40, a heater 50, a controller 80, and the like.

The processing chamber 10 can depressurize the inside of the processing chamber 10 and accommodate the wafer W. The processing chamber 10 includes a cylindrically shaped inner tube 11 having a ceiling and an open lower end and a cylindrically shaped outer tube 12 having an open lower end to cover the outer side of the inner tube 11. The inner tube 11 and the outer tube 12 are formed of a heat-resistant material, such as quartz, arranged to be concentric to form a double tube structure.

The ceiling of the inner tube 11 is flat, for example. An accommodating section 13 is formed on one side of the inner tube 11 to accommodate a gas nozzle along a longitudinal direction of the inner tube 11 (an up and down direction). In the present embodiment, a portion of a side wall of the inner tube 11 protrudes outward to form a convex portion 14, and the inside of the convex portion 14 is formed as the accommodating section 13.

A rectangular opening 15 is formed to face the accommodating section 13 in a side wall on the other side of the inner tube 11 along the longitudinal direction of the inner tube 11 (the up and down direction).

The opening 15 is a gas exhaust port formed to exhaust the gas in the inner tube 11. The length of the opening 15 is formed to be the same as the length of a wafer boat 16 or is formed to respectively extend in the up and down direction to be longer than the length of the wafer boat 16.

The lower end of the processing chamber 10 is supported, for example, by a cylindrical manifold 17 formed of stainless steel. A flange 18 is formed on the upper end of the manifold 17 and a lower end of the outer tube 12 is disposed on the flange 18 to support the lower end of the processing chamber 10. A seal member 19, such as an O-ring, is interposed between the flange 18 and the lower end of the outer tube 12 to cause the inside of the outer tube 12 to be airtight.

An annular support 20 is provided on an inner wall of the upper portion of the manifold 17, and a lower end of the inner tube 11 is disposed on the support 20 to support the lower end of the processing chamber 10. In an opening at the lower end of the manifold 17, a lid 21 is airtightly attached through a seal member 22, such as an O-ring, to seal the opening at the lower end of the processing chamber 10, i.e., the opening in the manifold 17. The lid 21 is formed, for example, of stainless steel.

A rotating shaft 24 that rotatably supports the wafer boat 16 through a magnetic fluid seal 23 is provided to penetrate a central portion of the lid 21. A lower portion of the rotating shaft 24 is rotatably supported by an arm 25A of a lifting mechanism 25 including a boat elevator.

A rotating plate 26 is provided on an upper end of the rotating shaft 24, and the wafer boat 16 holding the wafers W is mounted on the rotating plate 26 through a thermal insulation base 27 formed of quartz. Thus, the lid 21 and the wafer boat 16 moves up and down together by the lifting mechanism 25 moving up and down, and the wafer boat 16 is inserted and removed from the processing chamber 10.

The wafer boat 16 can be accommodated in the processing chamber 10 and substantially horizontally holds multiple (e.g., 50 to 150) wafers W with intervals in the up and down direction.

A gas supply 30 is provided in the manifold 17. The gas supply 30 introduces a process gas into the inner tube 11. In the present embodiment, the process gas includes trisilylamine (TSA:$(SiH_3)_3N$) and an inert gas. Examples of the inert gas include a nitrogen gas ($N_2$) and an argon gas (Ar). The gas supply 30 includes a gas nozzle 31.

The gas nozzle 31 is, for example, formed of quartz and is provided in the inner tube 11 along the longitudinal direction of the inner tube 11 and is supported such that a base end portion is bent in an L-shape to penetrate the manifold 17. Multiple gas holes 32 are formed on the gas nozzle 31 along the longitudinal direction of the gas nozzle 31 to discharge a gas in the horizontal direction through the gas holes 32. Multiple gas holes 32 are arranged to have intervals equal to the intervals of the wafer W supported in the wafer boat 16, for example. The gas nozzle 31 is a nozzle that supplies a gas, such as a deposition gas, a cleaning gas, a purge gas, or the like, and supplies the gas to the processing chamber 10 as needed while controlling the flow rate.

Here, in the example of FIG. 1, although a case in which the gas supply 30 includes one gas nozzle 31 has been described, the form of the gas supply 30 is not limited thereto. For example, the gas supply 30 may include multiple gas nozzles. In this case, TSA and $N_2$ may be introduced from the same gas nozzle into the inner tube 11 or from different gas nozzles into the inner tube 11.

The exhaust 40 exhausts a gas that is exhausted from the inside of the inner tube 11 through the opening 15 and that is exhausted from a gas outlet port 41 through a space P1 between the inner tube 11 and the outer tube 12. The gas outlet port 41 is formed on a side wall of the upper portion of the manifold 17 and above the support 20. An exhaust path 42 is connected to the gas outlet port 41. A pressure adjusting valve 43 and a vacuum pump 44 are sequentially interposed in the exhaust path 42, so that the inside of the processing chamber 10 can be exhausted.

The heater 50 is disposed around the outer tube 12. The heater 50 is provided, for example, on a base plate 28. The heater 50 has a cylindrical shape to cover the outer tube 12. The heater 50 includes, for example, a heating element to heat the wafers W in the processing chamber 10.

The controller 80 controls an operation of each section of the processing apparatus 1. The controller 80 may be, for example, a computer. A computer program for operating each section of the processing apparatus 1 is stored in a storage medium 90. The storage medium 90 may be, for example, a flexible disk, a compact disk, a hard disk, a flash memory, a DVD, or the like.

[Deposition Method]

Figure 2:
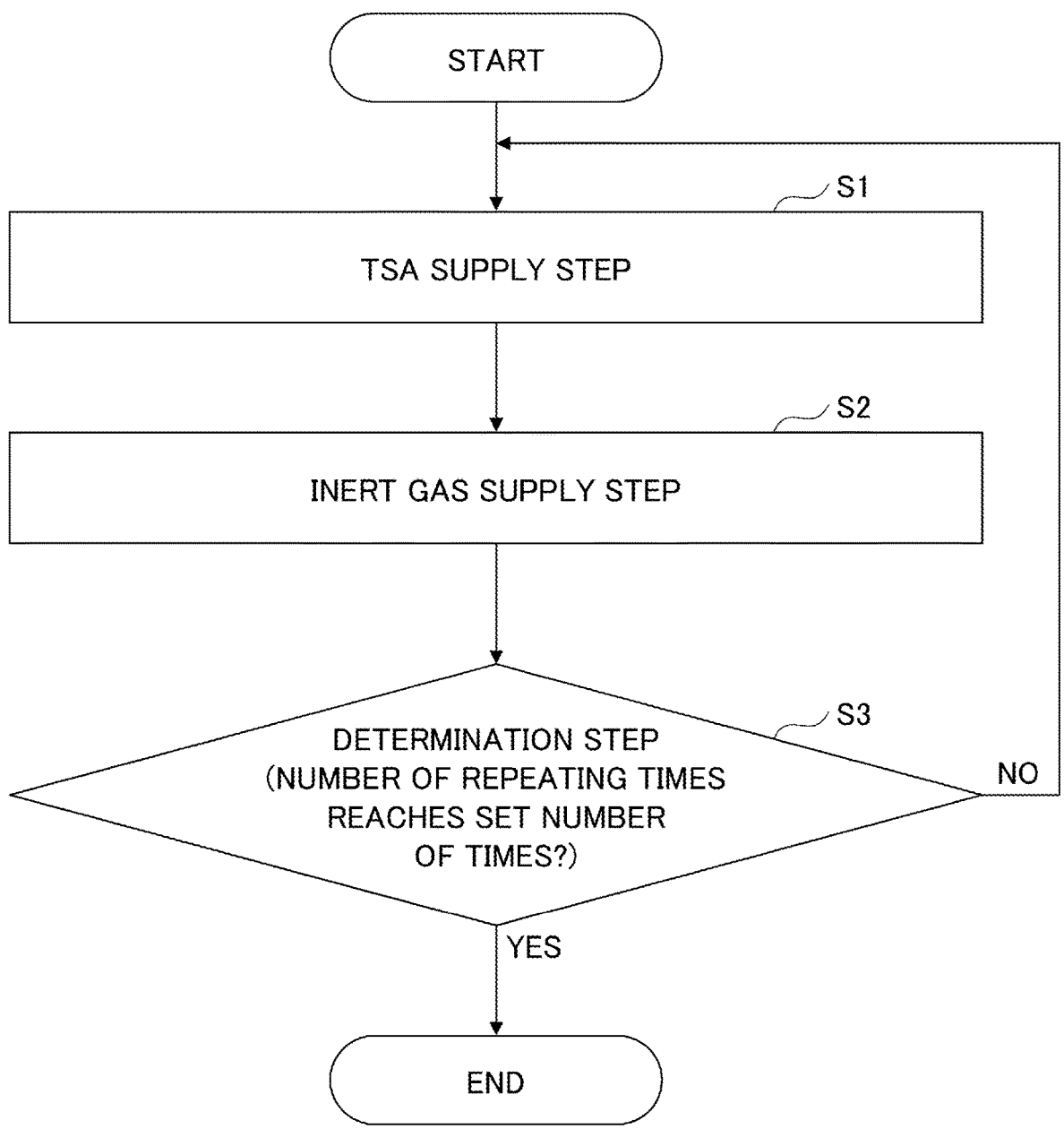
FIG. 2 is a flowchart illustrating an example of a deposition method of the embodiment.

An example of a deposition method according to the embodiment will be described with reference to FIG. 2. In the following, an example in which a silicon nitride film (an SiN film) is deposited in the above-described processing apparatus 1 will be described. The film deposition method described below is performed by the controller 80 controlling the operation of each section of the processing apparatus 1.

First, the wafer boat 16 in which multiple wafers W are mounted is transferred into the processing chamber 10 by lifting the wafer boat from below. Subsequently, the lid 21 closes the opening at the lower end of the manifold 17, so that the inside of the processing chamber 10 becomes an enclosed space.

Then, the inside of the processing chamber 10 is vacuumed to maintain the process pressure, and the power supplied to the heater 50 is controlled to raise the temperature of the wafer to the process temperature. The process temperature is set at a temperature greater than or equal to a temperature at which the Si—H bond of TSA is broken, e.g. 450° C. After the temperature of the wafer is stabilized at the process temperature, the film deposition process is started while the wafer boat 16 is rotated.

In the film deposition process, the silicon nitride film is deposited on the surface of the wafer W by intermittently supplying TSA into the processing chamber 10. In the present embodiment, as illustrated in FIG. 2, by repeating a TSA supply step S1 and an inert gas supply step S2 until the number of repeating times reaches the number of times that is set in a determination step S3, the silicon nitride film is deposited on the surface of the wafer W.

In the TSA supply step S1, TSA is supplied from the gas holes 32 of the gas nozzle 31 into the processing chamber 10. This causes TSA to be adsorbed on the surface of the wafer W and a silicon nitride layer is formed. Because the wafer W is heated to a temperature greater than or equal to a temperature at which the Si—H bond of TSA is broken, for example, 450° C., the Si—H bond of TSA is broken and H is removed from TSA. In the TSA supply step S1, the TSA supply time is, for example, 5 seconds to 10 seconds.

In the inert gas supply step S2, $N_2$ is supplied as the inert gas from the gas holes 32 of the gas nozzle 31 into the processing chamber 10. This causes residual TSA in the processing chamber 10 to be exhausted from the processing chamber 10. Additionally, H removed from TSA in the TSA supply step S1 is exhausted together with $N_2$ from the processing chamber 10. In the inert gas supply step S2, the $N_2$ supply time is, for example, 20 seconds to 60 seconds.

In the determination step S3, it is determined whether the number of repeating times of performing the TSA supply step S1 and the inert gas supply step S2 reaches the set number of times. In the determination step S3, when it is determined that the number of repeating times of performing the TSA supply step S1 and the inert gas supply step S2 has reached the set number of times, the film deposition process is completed. In the determination step S3, when it is determined that the number of repeating times of performing the TSA supply step S1 and the inert gas supply step S2 does not reach the set number of times, the process returns to the TSA supply step S1.

After the film deposition process is completed, the wafer W is transferred to the outside from the processing chamber 10 in the reverse order of the procedure in which the wafer W is transferred into the processing chamber 10.

As described above, according to the deposition method of the embodiment, by repeating the TSA supply step S1 and the inert gas supply step S2 until the number of repeating times reaches the number of times that is set in the determination step S3, the silicon nitride film is deposited on the surface of the wafer W. This allows the silicon nitride film to be deposited while H is removed from TSA by breaking the Si—H bond of TSA. As a result, a silicon nitride film having a low hydrogen density in the film can be deposited. Additionally, as will be described later, in the silicon nitride film, as the hydrogen density in the film decreases, the wet etch resistance increases. Therefore, according to the film deposition process of the embodiment, the silicon nitride film having the high wet etch resistance can be deposited.

Here, in the above-described embodiment, the case in which the TSA supply step S1 and the inert gas supply step S2 are alternately repeated to intermittently supply TSA into the processing chamber 10 has been described. However, the present embodiment is not limited thereto. For example, instead of the inert gas supply step S2, a vacuum step of exhausting the inside of the processing chamber 10 without supplying the inert gas into the processing chamber 10 may be performed. That is, the TSA supply step S1 and the vacuum step may be alternately repeated to intermittently supply TSA into the processing chamber 10.

EXAMPLE

An example in which the film characteristics of the silicon nitride film deposited by the deposition method according to the above-described embodiment are evaluated, will be described. In the example, the silicon nitride film was deposited on the surface of the wafer W by alternately repeating the supply of TSA and the supply of $N_2$, and the film characteristics of the silicon nitride film were evaluated. As a comparative example, the silicon nitride film was deposited on the surface of the wafer W by alternately repeating a supply of dichlorosilane (DCS) and a supply of ammonia ($NH_3$) activated by plasma, and the film characteristics of the silicon nitride film were evaluated.

Figure 3:
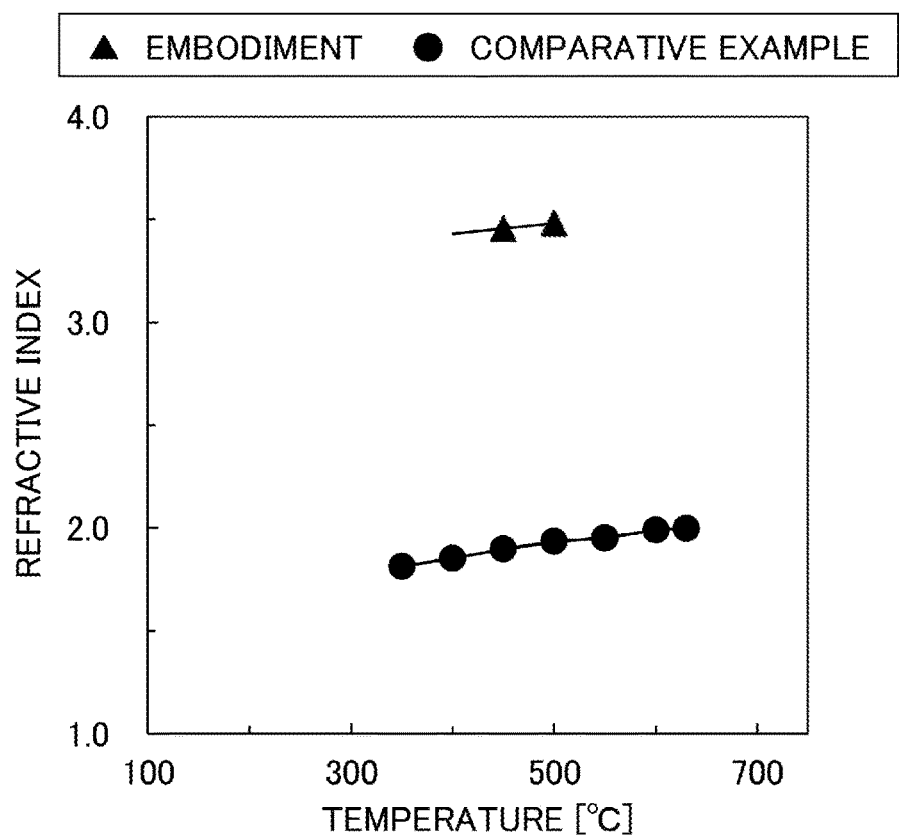
FIG. 3 is a graph comparing refractive indices of silicon nitride films.

FIG. 3 is a graph comparing the refractive indices of the silicon nitride films. In FIG. 3, the horizontal axis indicates the temperature [° C.] of the wafer when the silicon nitride film is deposited, and the vertical axis indicates the refractive index of the silicon nitride film. In FIG. 3, the results of the embodiment are indicated by the triangles and the results of the comparative example are indicated by the circles.

As indicated in FIG. 3, in the example, the refractive index of the silicon nitride film is about 3.5 when the temperature of the wafer is between 450° C. and 500° C. In the comparative example, the refractive index of the silicon nitride film is about 2.0 when the temperature of the wafer is between 350° C. and 650° C. These results indicate that a silicon nitride film having a high refractive index can be deposited in the example in comparison with the comparative example. Because, as the refractive index of the silicon nitride film increases, the silicon nitride film becomes a silicon-rich film, which has a high silicon content rate, it is conceivable that a silicon-rich silicon nitride film can be deposited in the example in comparison with the comparative example. That is, according to the deposition method in which the supply of TSA and the supply of $N_2$ are alternately repeated, it is conceivable that a silicon-rich silicon nitride film can be deposited.

Figure 4:
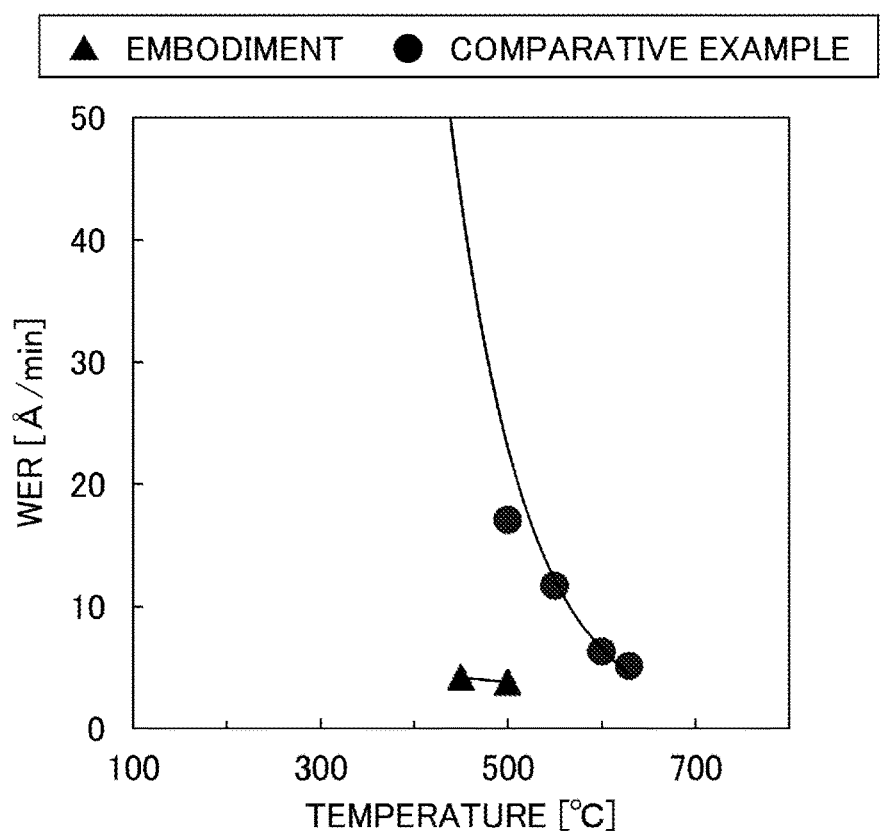
FIG. 4 is a graph comparing the WERs of the silicon nitride films.

FIG. 4 is a graph comparing wet etching rates (WERs) of the silicon nitride films. In FIG. 4, the horizontal axis indicates the temperature [° C.] of the wafer when the silicon nitride film is deposited, and the vertical axis indicates the WER [Å/min], which is the etching rate used when the silicon nitride film is etched with 0.5% dilute hydrofluoric acid (DHF). In FIG. 4, the results of the example are indicated by the triangles and the results of the comparative example are indicated by the circles.

As indicated in FIG. 4, in the example, the WER is about 4.0 Å/min when the temperature of the wafer is between 450° C. and 500° C. In the comparative example, the WER is greater than or equal to 10 Å/min when the temperature of the wafer is less than or equal to 550° C. These results indicate that in the example, a silicon nitride film with a low WER can be deposited at a low temperature (e.g., 500° C. or less) in comparison with the comparative example. That is, according to the deposition method in which the supply of TSA and the supply of $N_2$ are alternately repeated, it is conceivable that a silicon nitride film with a low WER can be deposited at a low temperature.

Figure 5:
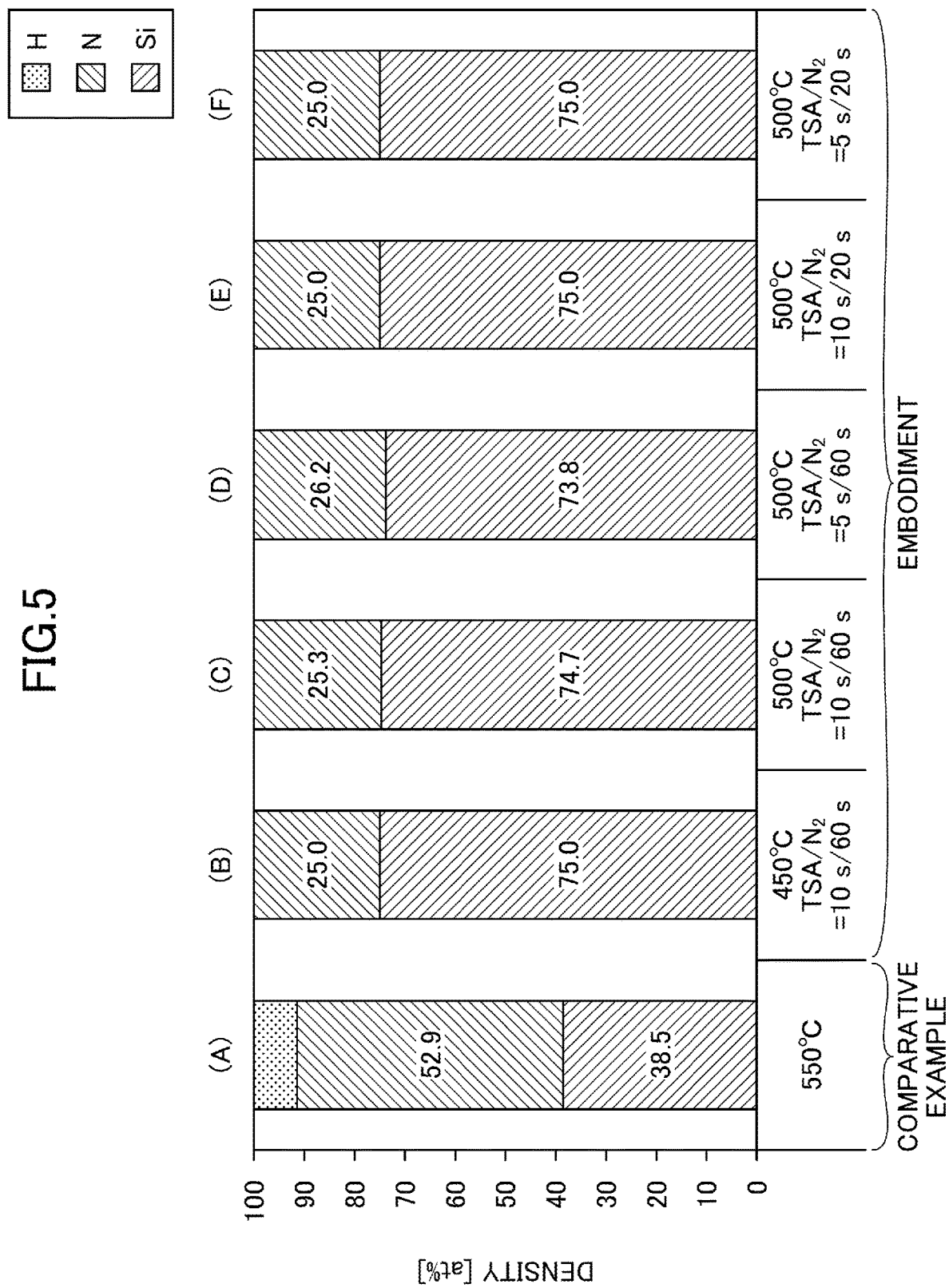
FIG. 5 is a graph comparing compositions of the silicon nitride films.

FIG. 5 is a graph comparing the compositions of the silicon nitride films. FIG. 5 indicates the composition of silicon (Si), nitrogen (N), and hydrogen (H) contained in the silicon nitride film that is measured by the Rutherford backscattering spectrometry (RBS)/hydrogen forward-scattering spectroscopy (HFS). In FIG. 5, the result of the comparative example is indicated in the bar A and the results of the examples are indicted in the bars B to F. More specifically, the bar A indicates the film composition of the silicon nitride film deposited by alternately repeating the supply of DCS and the supply of $NH_3$ activated by plasma in a state in which the temperature of the wafer is set to 500° C. The bar B indicates the film composition of the silicon nitride film deposited by alternately repeating the supply of TSA and the supply of $N_2$ in a state in which the temperature of the wafer is set to 450° C. The bars C to F indicate the film composition of the silicon nitride film deposited by alternately repeating the supply of TSA and the supply of $N_2$ in a state in which the temperature of the wafer is set to 500° C. Additionally, the bars B to F indicate the film composition when the TSA supply time and $N_2$ supply time (TSA/$N_2$) are set to 10 seconds/60 seconds, 10 seconds/60 seconds, 5 seconds/60 seconds, 10 seconds/20 seconds, and 5 seconds/20 seconds, respectively.

As indicated in FIG. 5, in the examples, the composition ratio of Si to N (Si:N) in the silicon nitride film is 3:1 and the density of H is approximately 0%, even when the temperature of the wafer and TSA/$N_2$ are changed. The results indicate that the process margin is large in the examples. Additionally, in the examples, when the temperature of the wafer is 450° C. to 500° C., the Si—H bond of TSA is broken during the deposition of the silicon nitride film, and H is removed from TSA. In the comparative example, the composition ratio of Si, N, and H (Si:N:H) in the silicon nitride film is 38.5:52.9:8.6. From this result, it is conceivable that H is not easily removed during the deposition of the silicon nitride film in the comparative example.

Figure 6:
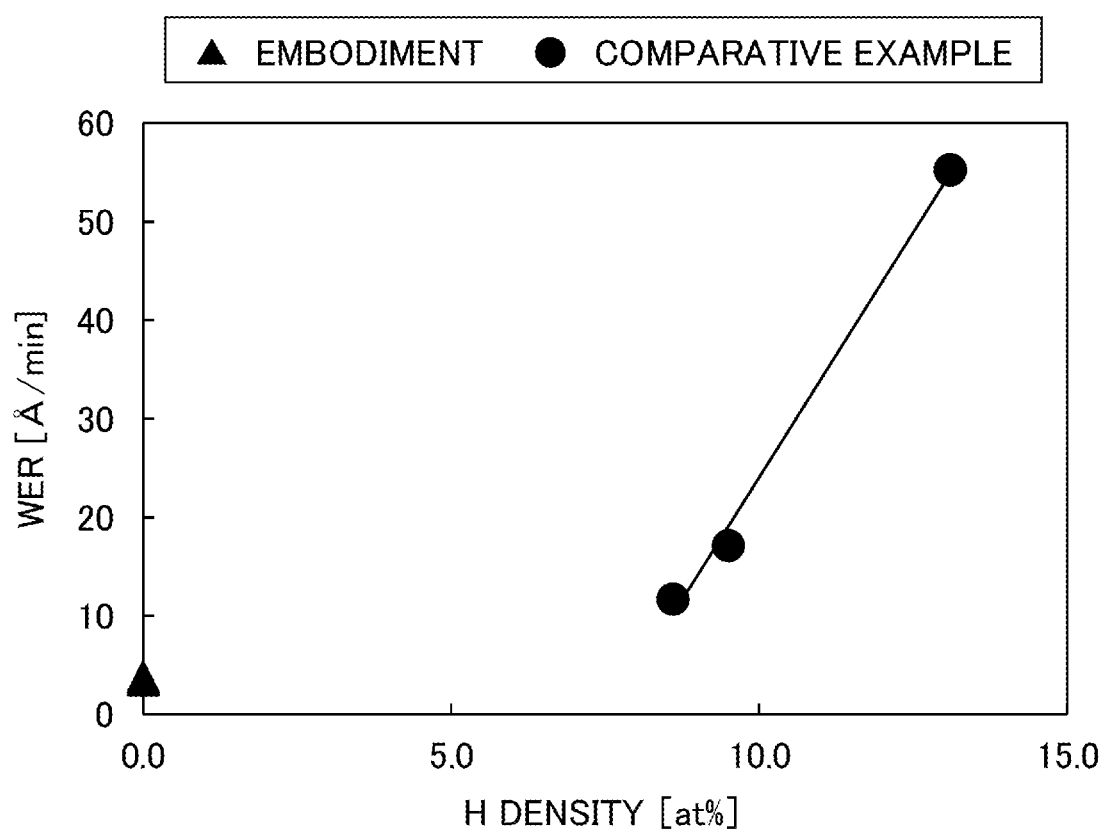
FIG. 6 is a graph indicating a result of measuring the relationship between the hydrogen density and the WER in the silicon nitride film.

FIG. 6 is a graph illustrating the results of measuring the relationship between the hydrogen density and the WER in the silicon nitride film. In FIG. 6, the horizontal axis indicates the hydrogen density [at %] in the silicon nitride film, and the vertical axis indicates the WER [Å/min] when the silicon nitride film is etched with 0.5% DHF. In FIG. 6, the results of the examples are indicated by the triangles and the results of the comparative example are indicated by the circles.

As indicated in FIG. 6, there is a positive correlation between the hydrogen density in the silicon nitride film and the WER, and it can be seen that, as the hydrogen density in the silicon nitride film decreases, the WER decreases. From this result, it can be said that in order to deposit a silicon nitride film having high etch resistance, it is important to reduce the hydrogen density in the silicon nitride film.

Figure 7A:
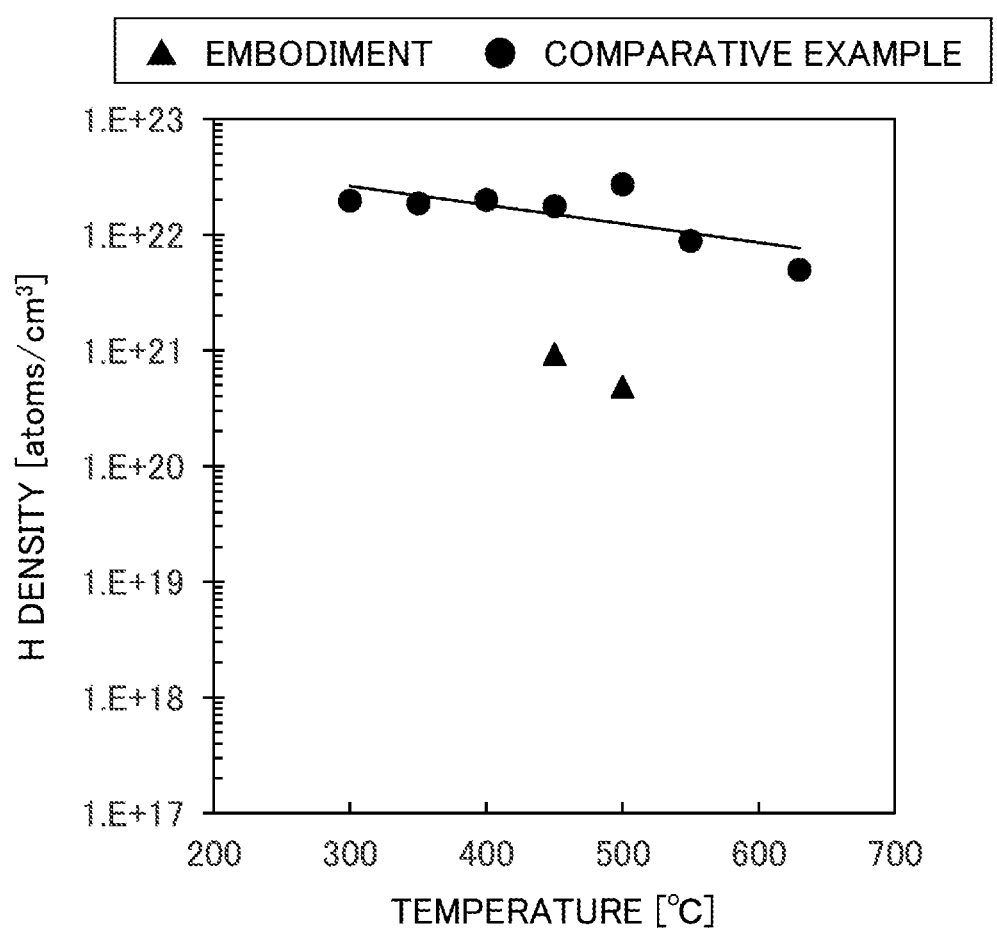
FIG. 7A and FIG. 7B are graphs comparing the hydrogen densities and the chlorine densities in the silicon nitride films.
Figure 7B:
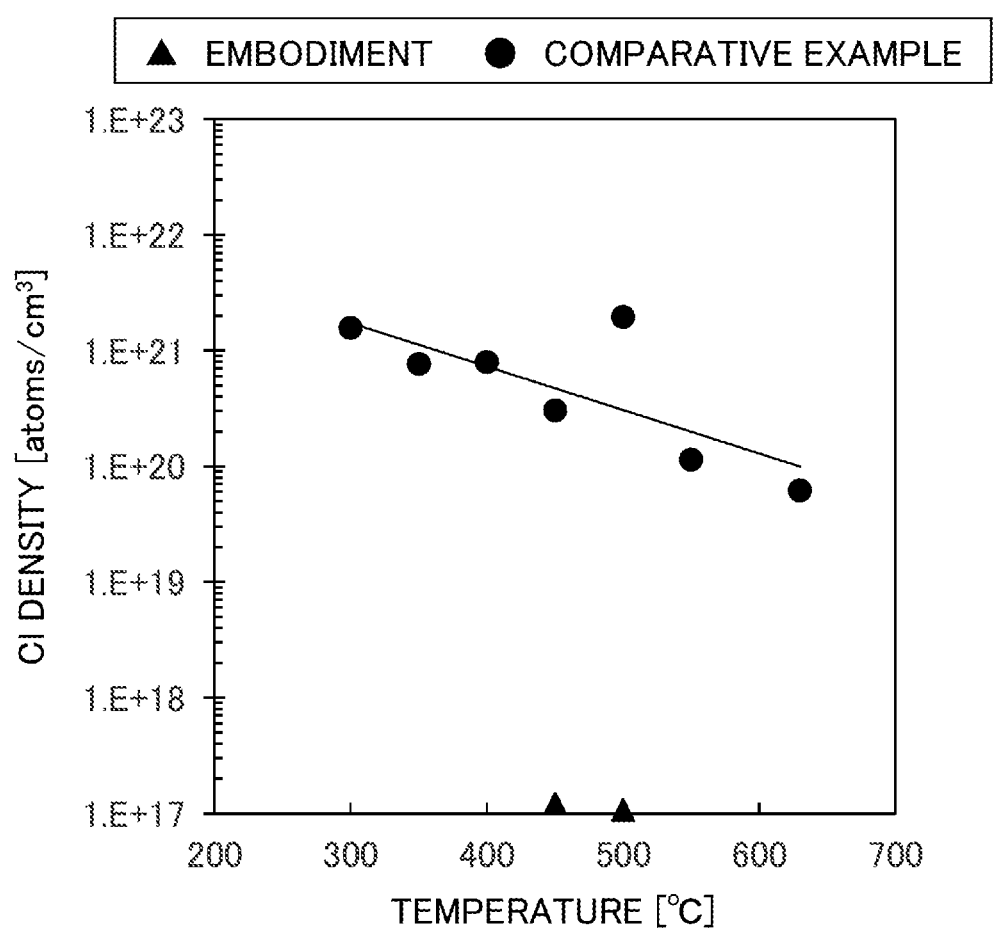

FIG. 7A and FIG. 7B are graphs respectively comparing the hydrogen (H) density and the chlorine (Cl) density in the silicon nitride film. FIG. 7A and FIG. 7B respectively indicate the H density and the Cl density in the silicon nitride film that is measured by secondary ion mass spectrometry (SIMS). Here, the lower limit of the detection of the Cl density by SIMS is $1 \times 10^{17}$. FIG. 7A indicates results of measuring the H density in the film, and FIG. 7B indicates results of measuring the Cl density in the film. In FIG. 7A, the horizontal axis represents the temperature [° C.] of the wafer when the silicon nitride film is deposited, and the vertical axis indicates the H density [atoms/cm$^3$] in the silicon nitride film. In FIG. 7B, the horizontal axis indicates the temperature [° C.] of the wafer when the silicon nitride film is deposited, and the vertical axis indicates the Cl density [atoms/cm$^3$] in the silicon nitride film. In FIG. 7A and FIG. 7B, the results of the example are indicated by the triangles and the results of the comparative example are indicated by the circles.

As indicated in FIG. 7A, in the example, the H density in the film is lower than that in the comparative example by about 1 to 2 orders of magnitude. Additionally, as indicated in FIG. 7B, in the example, the Cl density in the film is the lower limit of the detection, and it can be seen that Cl is not present in the silicon nitride film. It is conceivable that this is due to the use of TSA in the example, which is a halogen-free precursor.

FIG. 8 is a diagram comparing the cross-sectional shape and the step coverage of the silicon nitride film, indicating the result of the example on the left, and indicating the result of the comparative example on the right. More specifically, on the left side of FIG. 8, the cross-sectional shape and the step coverage of the silicon nitride film deposited on recesses by alternately repeating the supply of TSA and the supply of N$_2$ in a state in which the temperature of the wafer is set to 500° C. are indicated. On the right side of FIG. 8, the cross-sectional shape and the step coverage of the silicon nitride film deposited in the recesses by alternating repeating the supply of DCS and the supply of NH$_3$ activated by plasma in a state in which the temperature of the wafer is set to 550° C. are indicated.

Here, the cross-sectional shape is observed by a transmission electron microscope (TEM) and the step coverage is calculated based on the observed cross-sectional shape.

The step coverage indicates the percentage (%) of the film thickness of the silicon nitride film 120 at the lower portion of a sidewall 111 of a recess 110 relative to the film thickness of the silicon nitride film 120 at the upper portion of the sidewall 111 of the recess 110. That is, when the film thickness of the silicon nitride film 120 at the lower portion of the sidewall 111 of the recess 110 is equal to the film thickness of the silicon nitride film 120 at the upper portion of the sidewall 111 of the recess 110, the step coverage is 100%. Additionally, when the film thickness of the silicon nitride film 120 at the lower portion of the sidewall 111 of the recess 110 is thinner than the film thickness of the silicon nitride film 120 at the upper portion of the sidewall 111 of the recess 110, the step coverage is less than 100%. When the film thickness of the silicon nitride film 120 at the lower portion of the sidewall 111 of the recess 110 is thicker than the film thickness of the silicon nitride film 120 at the upper portion of the sidewall 111 of the recess 110, the step coverage is greater than 100%.

As indicated in FIG. 8, it can be seen that there is little difference in cross-sectional shape and the step coverage between the example and the comparative example. The results indicate that the embedding characteristics of the silicon nitride film in the recess in the example are equivalent to the embedding characteristics of the silicon nitride film in the recess in the comparative example.

According to the present disclosure, a silicon nitride film with high etch resistance can be deposited.

The embodiments disclosed herein should be considered to be exemplary in all respects and not restrictive. Omission, substitution, and modification can be made on the above embodiments in various forms without departing from the appended claims and spirit thereof.

In the above embodiments, a case, in which the processing apparatus is a batch-type apparatus that performs processing on multiple wafers at one time, has been described, but the present disclosure is not limited thereto. For example, the processing apparatus may be a sheet-type apparatus that processes wafers one by one. Additionally, the processing apparatus may be a semi-batch apparatus that rotates a rotating table to revolve multiple wafers disposed on the rotating table in the processing chamber and perform processing on the wafers by causing the wafers to sequentially pass a region in which a first gas is supplied and a region in which a second gas is supplied.

What is claimed is:

1. A method of depositing a silicon nitride film on a surface of a substrate, the method comprising:
   (a) supplying trisilylamine into a processing chamber accommodating the substrate;
   (b) supplying an inert gas into the processing chamber; and
   (c) alternately performing (a) and (b) to deposit the silicon nitride film on the surface of the substrate,
   wherein (c) is performed without plasma while H is removed from the trisilylamine by breaking a Si-H bond of the trisilylamine.

2. The method as claimed in claim 1, wherein the inert gas is a nitrogen gas.

3. The method as claimed in claim 1, wherein a temperature when the silicon nitride film is deposited is a temperature at which an Si-H bond of the trisilylamine is broken.

4. The method as claimed in claim 1, wherein a temperature when the silicon nitride film is deposited is greater than or equal to 450° C.

* * * * *